United States Patent
Green et al.

(10) Patent No.: US 9,508,889 B2
(45) Date of Patent: Nov. 29, 2016

(54) METHOD OF FORMING A GERMANIUM LAYER ON A SILICON SUBSTRATE

(71) Applicant: NEWSOUTH INNOVATIONS PTY LIMITED, Sydney, New South Wales (AU)

(72) Inventors: Martin Green, Bronte (AU); Xiaojing Hao, Matraville (AU); Chao-Yang Tsao, New Taipei (TW)

(73) Assignee: NEWSOUTH INNOVATIONS PTY LIMITED, Sydney (AU)

( * ) Notice: Subject to any disclaimer, the term of this patent is extended or adjusted under 35 U.S.C. 154(b) by 644 days.

(21) Appl. No.: 13/916,823

(22) Filed: Jun. 13, 2013

(65) Prior Publication Data

US 2014/0020748 A1   Jan. 23, 2014

Related U.S. Application Data

(63) Continuation of application No. PCT/AU2011/001599, filed on Dec. 12, 2011.

(30) Foreign Application Priority Data

Dec. 15, 2010 (AU) .............................. 2010905488

(51) Int. Cl.
*H01L 31/028* (2006.01)
*H01L 31/18* (2006.01)
(Continued)

(52) U.S. Cl.
CPC ........... *H01L 31/1816* (2013.01); *C23C 14/06* (2013.01); *C30B 23/02* (2013.01);
(Continued)

(58) Field of Classification Search
CPC . H01L 31/18; H01L 31/1816; H01L 31/028; H01L 21/02381; H01L 21/02532; H01L 21/02631; H01L 21/02658
See application file for complete search history.

(56) References Cited

U.S. PATENT DOCUMENTS

| 7,019,339 B2 | 3/2006 | Atwater, Jr. et al. |
| 2002/0090772 A1* | 7/2002 | Higashi ............... H01L 21/0237 438/166 |

(Continued)

FOREIGN PATENT DOCUMENTS

| JP | 2008021674 A | 1/2008 |
| JP | 2010226136 A | 10/2010 |
| WO | 2007109403 A2 | 9/2007 |

OTHER PUBLICATIONS

International Patent Application No. PCT/AU2011/001599, International Search Report mailed Feb. 21, 2012 (3 pages).

(Continued)

*Primary Examiner* — Selim Ahmed
(74) *Attorney, Agent, or Firm* — Kilpatrick Townsend & Stockton LLP (57) ABSTRACT

A method is presented for forming a Ge containing layer on a Si substrate. The method includes providing a crystalline Si substrate having a surface that has a crystallographic orientation, heating the Si substrate in a vacuum environment, exposing the Si substrate to a surfactant that is suitable for growth of the Ge containing layer on the crystalline Si using surfactant mediation, and thereafter growing the Ge containing layer on the surface of the heated Si substrate using a suitable sputtering technique. The conditions of the growth of the Ge containing layer are selected such that a thin Ge containing layer is formed on the surface of the Si substrate. The thin Ge containing layer has a surface that has crystallographic properties suitable for epitaxial growth of a layer of a further material on the surface of the thin Ge containing layer.

11 Claims, 10 Drawing Sheets

(51) Int. Cl.
  *C23C 14/06* (2006.01)
  *C30B 23/02* (2006.01)
  *C30B 29/08* (2006.01)
  *H01L 21/02* (2006.01)
  *H01L 31/0725* (2012.01)
  *H01L 31/0735* (2012.01)

(52) U.S. Cl.
  CPC ............ *C30B 23/025* (2013.01); *C30B 29/08* (2013.01); *H01L 21/02381* (2013.01); *H01L 21/02532* (2013.01); *H01L 21/02631* (2013.01); *H01L 21/02658* (2013.01); *H01L 31/028* (2013.01); *H01L 31/0725* (2013.01); *H01L 31/0735* (2013.01); *H01L 31/1852* (2013.01); *Y02E 10/544* (2013.01)

(56) References Cited

U.S. PATENT DOCUMENTS

2004/0012037 A1\* 1/2004 Venkatesan ........ H01L 21/76251
  257/200
2004/0065363 A1  4/2004 Fetzer et al.

OTHER PUBLICATIONS

Taiwanese Patent Application No. TW100146349, Office Action, mailed Oct. 13, 2015, 9 pages (5 pages for TW OA, 4 pages for English Translation).

Taiwanese Patent Application No. TW100146349, Decision of Rejection of Taiwan Intellectual Property Office, mailed Apr. 27, 2016, 10 pages (6 pages for TW OA, 4 pages for English Translation).

\* cited by examiner

METHOD OF FORMING A GERMANIUM LAYER ON A SILICON SUBSTRATE

CROSS-REFERENCE TO RELATED APPLICATIONS

This application is a continuation application of International Patent Application No. PCT/AU2011/001599, filed on Dec. 12, 2011, which claims priority to Australian Patent Application No. 2010905488, filed on Dec. 15, 2010, each of which is incorporated herein by reference in its entirety.

FIELD OF THE INVENTION

The present invention generally relates to a method of forming a germanium layer on a silicon substrate and a photovoltaic device that includes a germanium layer.

BACKGROUND OF THE INVENTION

A significant cost in the manufacture of devices such as high speed photodetectors and solar cells based on III-V class semiconductor materials is the cost of Ge substrates on which the III-V class semiconductor materials can be grown by epitaxy. As a more cost effective alternative, Ge layers have been grown on Si substrates to form virtual Ge substrates which then form the basis for epitaxial growth of the III-V class semiconductor materials. However, known heteroepitaxy methods of growing such Ge layers on Si wafer substrates require ultra-high vacuum conditions and the use of costly and extremely toxic germane gas.

Further, such methods often result in the Ge layer having a sub-optimal surface roughness and a threading dislocation density that may require post processing to improve the quality of the Ge layer.

Still further, to obtain a suitable Ge surface for growth of the III-V class semiconductor materials, a transition layer several micrometers thick and comprising a mixture of Ge and Si is typically required. The small bandgap and the strong photon absorption of Ge prevent that for such a thick Ge layer the underlying Si substrate can include a functioning Si cell.

There exists a need for technological advancement.

SUMMARY OF THE INVENTION

In accordance with a first aspect of the present invention, there is provided a method of forming a Ge containing layer on a Si substrate, the method comprising the steps of:
providing a crystalline Si substrate having a surface that has a crystallographic orientation;
heating the Si substrate in a vacuum environment;
exposing the Si substrate to a surfactant that is suitable for growth of the Ge containing layer on the crystalline Si using surfactant mediation; and thereafter
growing the Ge containing layer on the surface of the heated Si substrate using a suitable sputtering technique;
wherein conditions of the growth of the Ge containing layer are selected such that a thin Ge containing layer is formed on the surface of the Si substrate, the thin Ge containing layer having a surface that has crystallographic properties suitable for epitaxial growth of a layer of a further material on the surface of the thin Ge containing layer.

A residual gas of the vacuum environment may comprise a gas that functions as the surfactant. In one example, the surfactant is $H_2$ or atomic H. In another embodiment, the surfactant may be a suitable metallic material that is delivered to the surface of the Si substrate. For example, the surfactant may be Bi or Sb.

In accordance with a second aspect of the present invention, there is provided a method of forming a Ge containing layer on a Si substrate, the method comprising the steps of:
providing a crystalline Si substrate having a surface that has a crystallographic orientation;
heating the Si substrate in a vacuum environment;
exposing the Si substrate to a surfactant, the surfactant comprising hydrogen and being suitable for growth of the Ge containing layer on the crystalline Si using surfactant mediation; and thereafter
growing the Ge containing layer on the surface of the heated Si substrate using a suitable sputtering technique.

The vacuum environment may comprise a residual gas that comprises the hydrogen.

Conditions of the growth of the Ge containing layer typically are selected such that the Ge containing layer has a surface that has crystallographic properties suitable for epitaxial growth of a layer of a further material on the surface of the Ge containing layer.

The following will introduce features that embodiments of the present invention in accordance with the first or the second aspect of the present invention may have.

The Ge containing layer may mainly be composed of Ge and may also comprise a concentration of Si. The Ge containing layer typically has a surface that is composed of Ge. In one specific example the Ge containing layer has a graded concentration profile of material composition and a decreasing concentration of Si in a direction away from the surface of the Si substrate.

The steps of exposing the Si substrate to a surfactant and thereafter growing the Ge containing layer on the surface of the heated Si substrate using a suitable sputtering technique provides the significant advantage of allowing the thin Ge containing layer to be formed on the Si substrate having appropriate properties such as surface roughness and threading-location density so as to allow for the epitaxial growth of III-V class semiconductor materials. Further, ultra high vacuum (UHV) conditions typically are not required.

In addition, the Ge containing layer that has the surface suitable for epitaxial growth of the III-V material can be relatively thin. For example, the Ge containing layer may have a thickness of less than 1 µm, 500 nm, 400 nm, 300 nm, 200 nm or even thinner than that. For example, if the layer has a thickness of approximately 300 nm, the layer may comprise a 200 nm layer portion that forms a compositional graded junction layer on the silicon and a 100 nm layer portion of substantially pure germanium. The relatively small total thickness of the Ge containing layer portion facilitates transmission of incident light into the underlying Si substrate, which is especially advantages if the underlying Si comprises a Si photovoltaic cell.

In one embodiment, growth conditions are chosen such that no further annealing and/or polishing such as chemical-mechanical polishing (CMP) is required to achieve crystallographic properties suitable for epitaxial growth of the further material.

Prior to applying the sputtering technique, the Si substrate may be heated and baked in an atmosphere that contains a partial pressure of hydrogen, which may be conducted at a pressure in the mTorr range. For example, the Si substrate may be baked at a temperature of 450° C.-550° C., typically 500° C.

In one embodiment, the suitable sputtering technique is radio-frequency (RF) sputtering. Alternatively, pulsed DC sputtering may be used.

Achieving appropriate layer growth conditions comprise setting the temperature of the Si substrate to approximately 350-450° C., typically approximately 400° C., and providing an argon and hydrogen gaseous environment having a pressure in the mTorr range.

After the sputter deposition process, a silicon dioxide cap layer may be grown on the Ge containing layer, such as by a further sputter technique or another suitable technique. The Si substrate with the Ge containing layer may then be cooled to an appropriate temperature so as to minimise the tensile strain due to the larger linear thermal expansion coefficient of the Ge compared to the Si.

The further material typically is, or may comprise, a III-V class semiconductor material such as GaInP, GaAsP, Ga(In)As, GaAs—AlAs, GaAs—GaP, GaP—InP or any other appropriate III-V class semiconductor material.

The method typically also comprises the step of cleaning the surface of the Si substrate prior to heating the substrate.

In accordance with a third aspect of the present invention there is provided a photovoltaic device comprising:
  a Si substrate having front and back surfaces;
  a Ge containing layer positioned on the front surface of the Si substrate, the Ge containing layer being grown such that the Ge containing layer is suitable for epitaxial growth of a further material portion on a surface of the Ge containing layer;
  at least one photovoltaic cell positioned at least partially within the Ge containing layer and/or the Si substrate; and
  a further material portion grown on the surface of the Ge containing layer, the further material portion comprising at least one further photovoltaic cell.

The further material portion typically comprises III-V group materials and the at least one further photovoltaic cell typically is based on the III-V group materials.

In a first embodiment the Ge containing layer is a relatively thin layer and interconnects the material portion with the Si substrate, which in this embodiment comprises active regions of a Si photovoltaic cell. In a second embodiment the Ge layer is also relatively thin and comprises active regions of a Ge photovoltaic cell and the Si substrate may also comprise active regions of a Si photovoltaic cell. In a third embodiment the Ge containing layer may be thicker than in the first and second embodiments and the photovoltaic device comprises a Ge/Si heterojunction photovoltaic cell. Each of these embodiments has significant commercial advantages, which will be discussed further below.

The Ge containing layer may be formed by the method in accordance with the first aspect of the present invention.

The Ge containing layer may mainly be composed of Ge, but may also comprise a Si/Ge alloy. In one specific example the Ge containing layer has a graded concentration profile of material composition and a decreasing concentration of Si in a direction away from the surface of the Si substrate. In one specific example the Ge containing layer has a surface that is composed of Ge.

The Ge containing layer may have a thickness that is less than 300 nm, 200 nm, 100 nm, 50 nm or even as thinner than that.

However, for some embodiments the Ge containing layer may also be thicker than that, especially if the Ge containing layer comprises a significant amount of Si.

The material portion grown on the surface of the Ge containing layer may comprise at least one GaInP photovoltaic cell and/or at least one Ga(In)As photovoltaic cell.

The photovoltaic device may comprise a scattering surface that may be textured and may also be coated with a reflective material. The scattering surface typically is positioned at, or in the proximity of, the back surface of the Si substrate. The photovoltaic device is in this case typically arranged such that light that penetrates through the photovoltaic device towards the reflective surface is largely reflected back into the Si substrate and at least partially also into the Ge containing layer. The refractive index of the Ge containing layer typically is higher than that of the III-V material and consequently, dependent on the angle of incidence, total internal refection may further increase the path length of the photons in the Si substrate and the Ge containing layer whereby photon absorption in the Si and the Ge containing layer is increased. Further, light that is in use reflected at an interface between an exposed top surface of the material portion and a gaseous environment (usually air) by total internal reflection is also at least partially directed back to the Ge containing layer (and the Si substrate), which is particularly advantageous for absorption of light having a wavelength such that the light is mainly absorbed by the Ge containing layer, which may comprise active layers of a photovoltaic cell. Consequently, even if the Ge containing layer is relatively thin, resultant multiple direction of reflected light though the Ge containing layer may increase absorption of the Ge containing layer significantly.

The photovoltaic device typically comprises contact layers that are positioned for receiving electrical charges that in use are generated at p-n junctions of the photovoltaic cells.

The photovoltaic devices in accordance with the first, second and third embodiments of the present invention will now be described in further detail.

As mentioned above, in the first embodiment of the present invention the Ge containing layer interconnects the material portion with the Si substrate, which comprises the at least one Si photovoltaic cell. In this embodiment the Ge containing layer typically is a passive layer and relatively thin, such as thinner than 100 nm, 50 nm, or even thinner than that, which provides the advantage that absorption of photons by the Ge containing layer is relatively low even though Ge has a relatively high absorption coefficient and a bandgap of only approximately 0.67 eV. In this embodiment the Ge containing layer may also comprise a concentration of Si, which reduces the average absorption of the Ge containing layer and consequently allows increased layer thickness. In this embodiment the material portion typically comprises at least one III-V group material photovoltaic cell. The photovoltaic device typically is arranged such that photons that penetrate into the photovoltaic device penetrate, if not absorbed, in sequence through the at least one III-V group material photovoltaic cell, the Ge containing layer and the Si photovoltaic cell. The photovoltaic device typically comprises a textured scattering surface positioned at, or in the proximity of, the back surface of the Si substrate.

The Ge containing layer typically provides a relatively inexpensive basis for epitaxial growth of the material portion, as typically only a relatively small amount of Ge is required for growth of the Ge containing layer. Further, parasitic absorption of the Ge containing layer may be reduced such that a portion of photons that travel through the material portion and are not absorbed by the at least one III-V group material photovoltaic cell, penetrate also through the Ge containing layer and may be absorbed by the underlying Si photovoltaic cell.

In a second embodiment the Ge containing layer comprises active regions of a Ge photovoltaic cell. In this embodiment the Si substrate typically also comprises a photovoltaic cell. The Ge containing layer typically is sufficiently thin such that only a portion of incident photons is absorbed by the Ge cell and a further portion of incident photons penetrates through the Ge cell for absorption by the underlying Si photovoltaic cell. For example, the Ge containing layer may have a thickness of less than 50 nm, such as of the order of approximately 25-30 nm. In case of such a thin Ge containing layer, the photovoltaic device typically comprises heterojunctions at interfaces between the Ge containing layer and the material portion and between the Ge containing layer and the Si substrate. In this embodiment the material portion typically comprises at least one III-V group material photovoltaic cells, such as a GaInP and a Ga(In)As cell. The photovoltaic cell typically is arranged such that photons that penetrate into the photovoltaic device penetrate, if not absorbed, in sequence through the at least one III-V material photovoltaic cell, the Ge cell and the Si cell. The photovoltaic device typically comprises a textured scattering surface positioned at, or in the proximity of, the back surface of the Si substrate.

The photovoltaic device in accordance with the second embodiment of the present invention combines the advantage of relatively high transmissivity of the thin Ge containing layer with relatively high absorption of back reflected photons, which makes the device commercially very attractive, even though the Ge photovoltaic cell (which has a smaller bandgap than the Si photovoltaic cell) is positioned over the Si photovoltaic cell.

In a third embodiment of the present invention the photovoltaic device comprises a heterojunction that is formed at an interface between the Si substrate and the Ge containing layer and forms a part of a Ge/Si photovoltaic cell. The Ge containing layer typically has a thickness of more than 100 nm, 200 nm, 300 nm or more. In this embodiment the material portion typically comprises at least one III-V group material photovoltaic cells. The photovoltaic cell typically is arranged such that photons that penetrate into the photovoltaic device penetrate, if not absorbed, in sequence at one III-V group material photovoltaic cell, the Ge/Si cell formed at the heterojunction between the Ge containing layer and the Si. The photovoltaic device typically comprises a textured scattering surface positioned at, or in the proximity of, the back surface of the Si substrate.

BRIEF DESCRIPTION OF THE DRAWINGS

In order that the present invention may be more clearly ascertained, embodiments of the present invention will now be described, by way of example only, with reference to the accompanying drawings, in which.

DETAILED DESCRIPTION OF EMBODIMENTS OF THE PRESENT INVENTION

In general, the invention provides a method for growing a layer of Ge on a Si substrate by using a suitable sputtering technique. In specific embodiments, there is provided a method for growing a thin relaxed single crystalline Ge heteroepitaxial layer on a Si substrate by using radio-frequency (RF) sputtering.

Growing such a Ge layer on a Si substrate provides a virtual substrate that can be used as a base on which III-V class semiconductor materials may be grown, thereby avoiding the need for relatively expensive Ge.

Further, growing the Ge layer by a suitable sputtering technique such as RF sputtering avoids the need for an ultra-high vacuum (which can increase the cost of production) and/or germane gas (which is costly and toxic) that would otherwise be required if methods such as chemical vapour deposition (CVD) or molecular beam epitaxy (MBE) were used.

In one embodiment, the method includes the steps of: pre-cleaning a Si wafer in a standard cleaning procedure; evacuating the chamber to a pressure below $6.5 \times 10^{-7}$ Torr; sputter-depositing a Ge layer on the Si wafer at 400° C. at 1.5 mTorr in a mixture of argon and hydrogen; and depositing a $SiO_2$ cap layer on the epitaxial Ge layer at 200° C. at 1.5 mTorr in argon. This embodiment will be described in more detail below.

With reference to FIGS. 1, 2a, 2b and 2c, there is shown a method 10 for growing a layer of Ge on a Si substrate. The method 10 comprises a first step 12 of providing a crystalline Si substrate 20 having a surface 22 that has a crystallographic orientation.

Figure 2A:
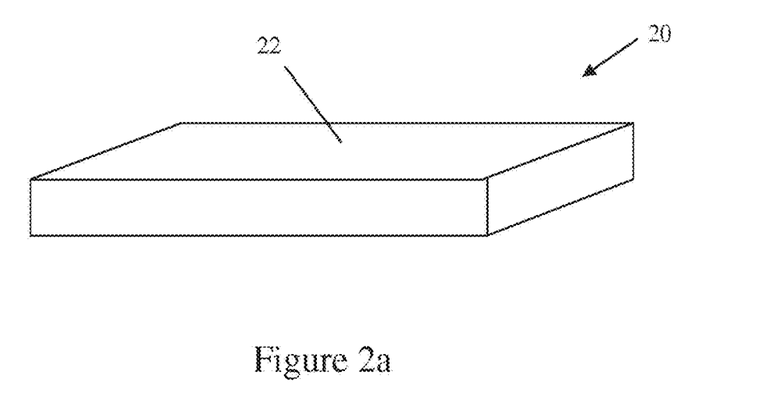
FIG. 2a shows a Si substrate upon which a Ge layer may be formed.

In this example, The Si surface 22 has a (100) crystallographic orientation. It is to be appreciated that alternatively the Si surface may have other orientations, such as (111).

The surface 22 can be cleaned of impurities using an appropriate cleaning technique such as a cleaning technique comprising the following steps:

a) cleaning organic residues from the surface 22 using Piranha solution;
b) removing organic contaminants from the surface 22 using the RCA-1 cleaning procedure;
c) removing metallic contaminants from the surface 22 using the RCA-2 cleaning procedure;
d) dipping the surface 22 in a hydrogen fluoride (HF); and
e) rinsing the surface 22 in deionised (DI) water.

Figure 1:
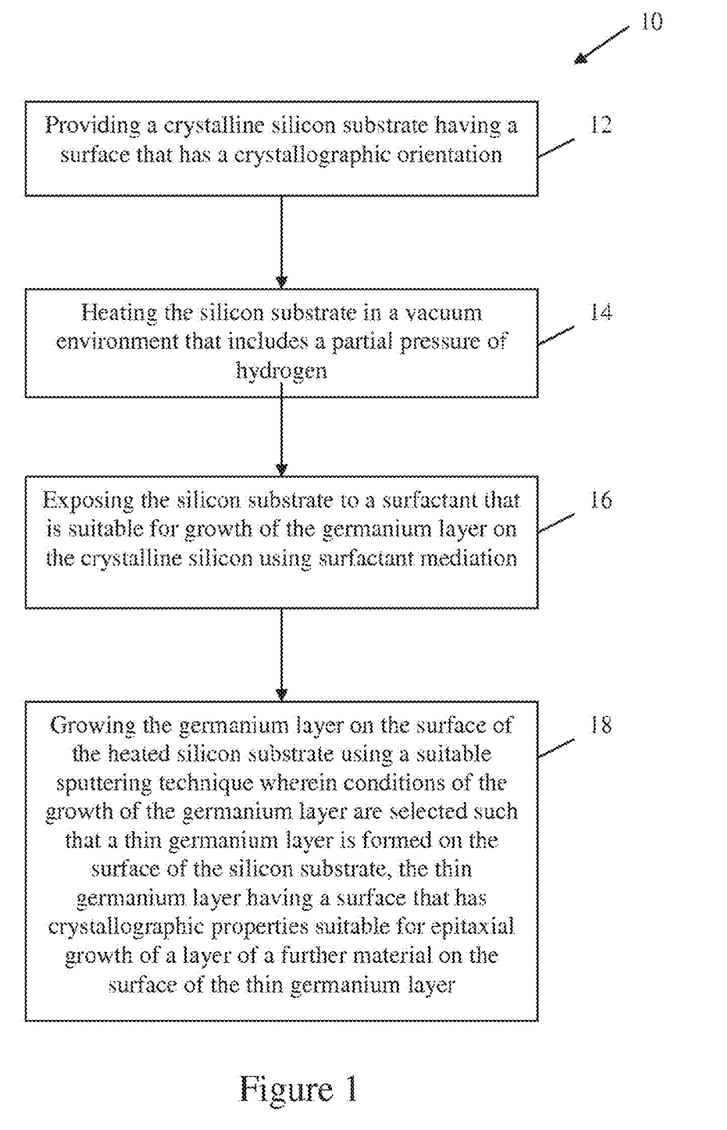
FIG. 1 is a flow diagram showing a method of forming a Ge layer on a Si substrate.

The method 10 comprises a second step 14 of heating the Si substrate in a vacuum environment that includes a partial pressure of hydrogen.

In one embodiment, this is achieved by loading the Si substrate 20 into a load lock chamber of a radio frequency (RF) magnetron sputter system and the pressure of the load lock chamber is reduced. The RF magnetron sputter system may be any appropriate system.

The Si substrate 20 is then transferred into a sputter deposition chamber of the RF magnetron sputter system when the vacuum of the load lock chamber reaches $4 \times 10^{-6}$ mBar so as to minimise the amount of air introduced into the sputter deposition chamber.

The temperature of the sputter deposition chamber is then increased to approximately 500° C. The Si substrate 20 is then baked at this temperature for approximately 15 minutes in a hydrogen atmosphere at 1.2 mTorr.

Figure 2B:
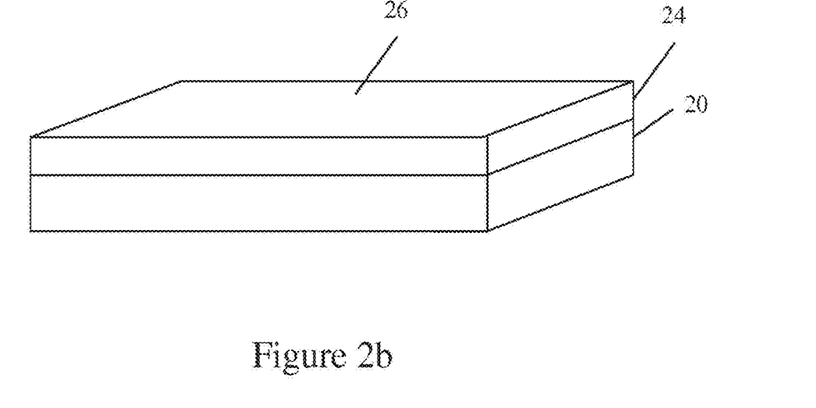
FIG. 2b shows a Si substrate having a Ge layer formed thereon in accordance with the method of FIG. 1.
Figure 2C:
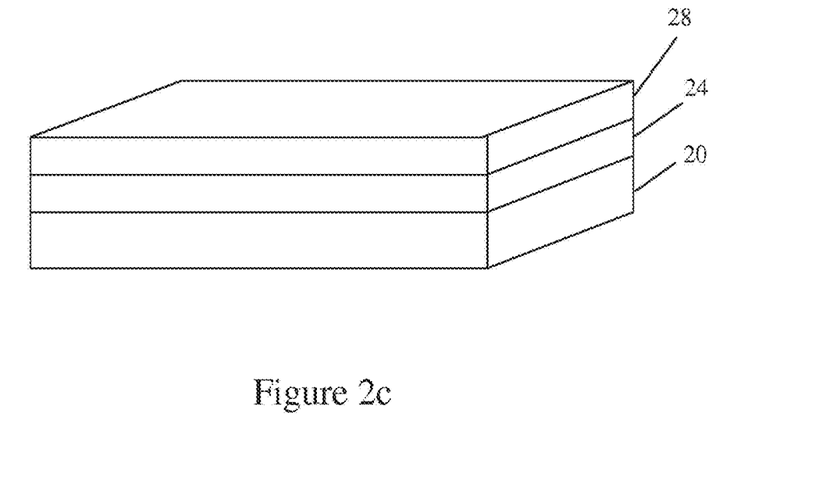
FIG. 2c shows the Si substrate and Ge layer of FIG. 2b and having a further material formed on a surface of the Ge layer.

The method 10 comprises a third step 16 of exposing the Si substrate to a surfactant that is suitable for growth of the Ge layer on the crystalline Si using surfactant mediation, and a fourth step 18 of growing the Ge layer on the surface of the heated Si substrate using a suitable sputtering technique. The conditions of the growth are selected such that a thin Ge layer is formed on the surface of the Si substrate, the thin Ge layer having a surface 26 that has crystallographic properties suitable for epitaxial growth of a layer of a further material 28 on the surface 26 of the thin Ge layer.

In this example, the third and fourth steps 16, 18 are achieved by decreasing and stabilising the temperature of the Si substrate 20 to approximately 400° C., being a desirable temperature for heteroepitaxial growth, for approximately 5 minutes. A sputter deposition process of epitaxially growing Ge on the surface 22 of the Si substrate 20 in an argon and hydrogen atmosphere at 1.5 mTorr is then started. In this example, the deposition rate is about 5 nm/minute.

Subsequently, a sputter deposition process to form a Si dioxide cap layer on the Ge layer 24 is carried out at 200° C. in an atmosphere of argon at 1.5 mTorr at a deposition rate of about 5 nm/minute.

After the sputter deposition process has ended, the Si substrate 20 having a Ge layer 24 is then cooled naturally to an appropriate temperature greater than or equal to 80° C. so as to minimise the tensile strain due to the larger linear thermal expansion coefficient of Ge ($5.8 \times 10^{-6}$ K$^{-1}$) compared to Si ($2.6 \times 10^{-6}$ K$^{-1}$).

Figure 3A:
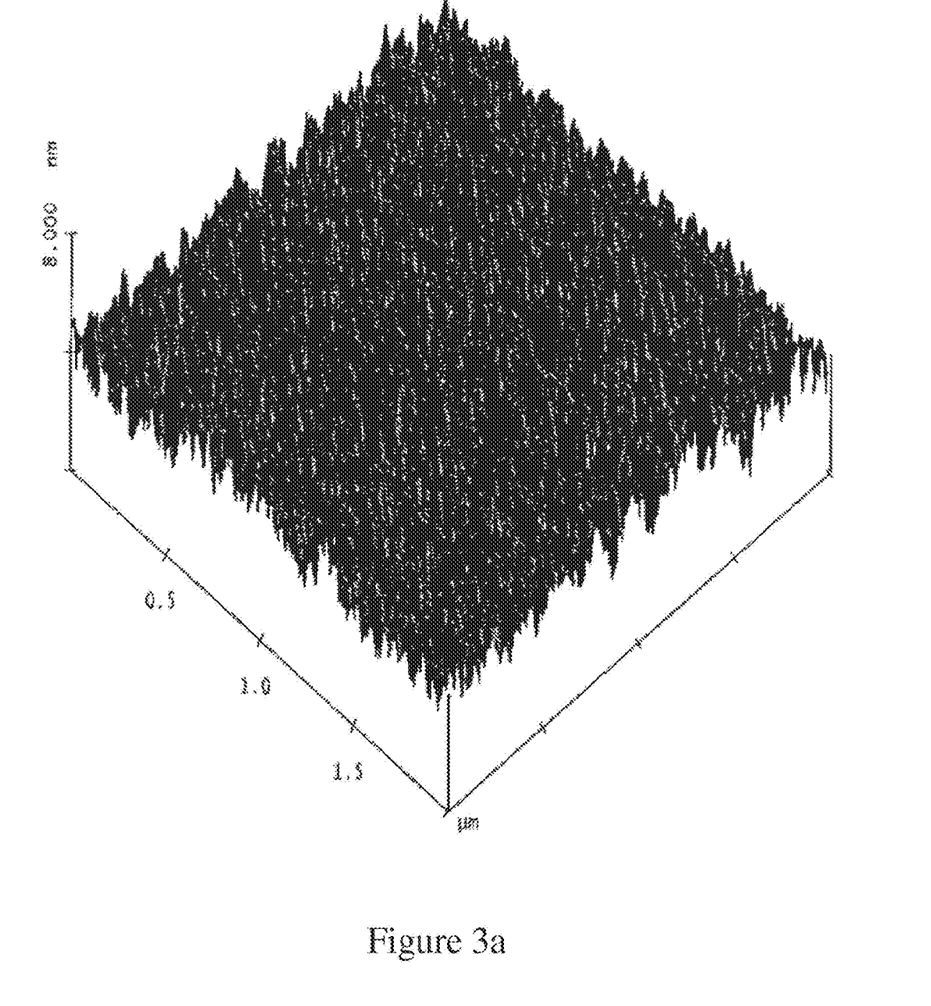
FIG. 3a shows a three dimensional atomic force microscope (AFM) image of a surface of the Ge layer of FIG. 2b.
Figure 3B:
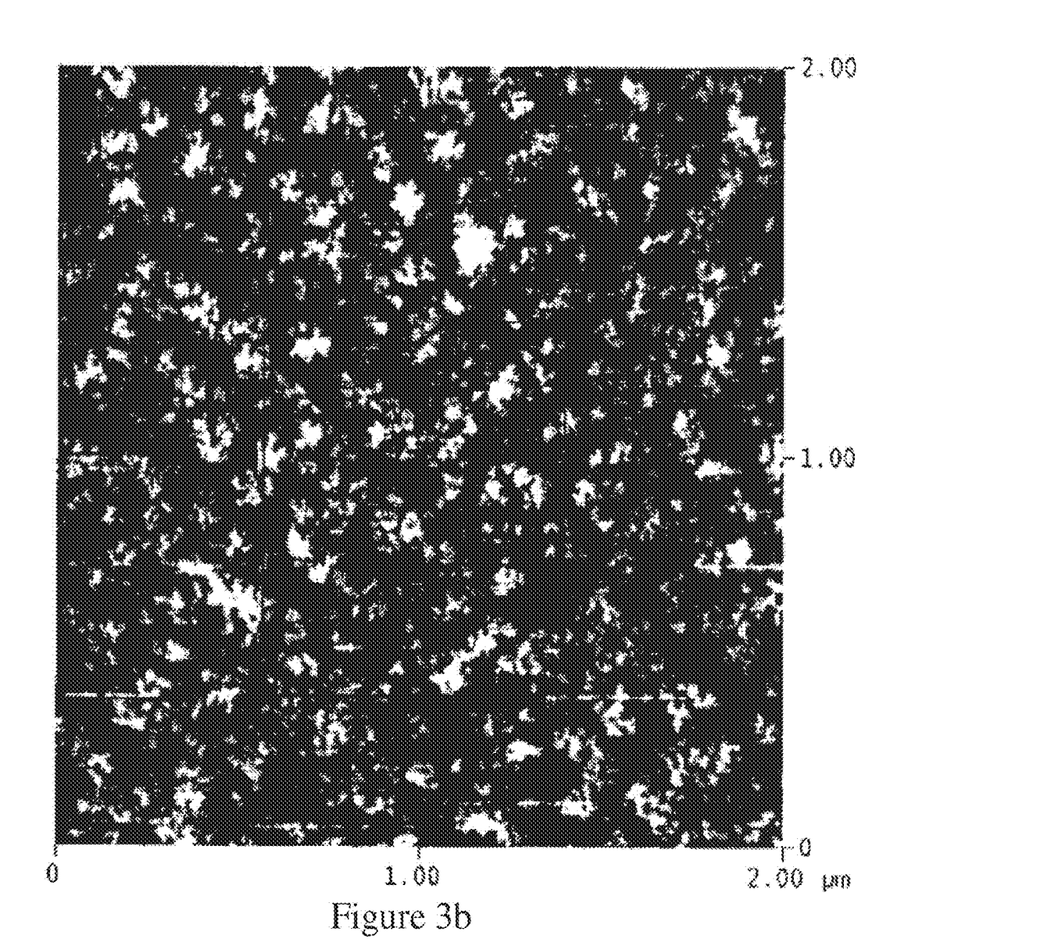
FIG. 3b shows a two dimensional AFM image of a surface of the Ge layer of FIG. 2b.

FIGS. 3a and 3b show the results of a surface morphology analysis by atomic force microscopy (AFM) of the surface 26 of the Ge layer 24 formed in accordance with the method 10. FIG. 3a shows a typical 3-dimensional AFM image and FIG. 3b shows a typical 2-dimensional AFM image of the Ge surface 26. Each image has a dimension of 2 μm×2 μm. In this example, the root-mean-square (RMS) roughness value of the Ge surface 26 is 0.564 nm. The low level of surface roughness is evidence of suppression of Stranski-Krastanow growth of the Ge layer 24 formed in accordance with method 10. In particular, it is noted that the resultant RMS roughness value of the Ge surface 26 is lower than those obtained by prior art methods.

Figure 4A:
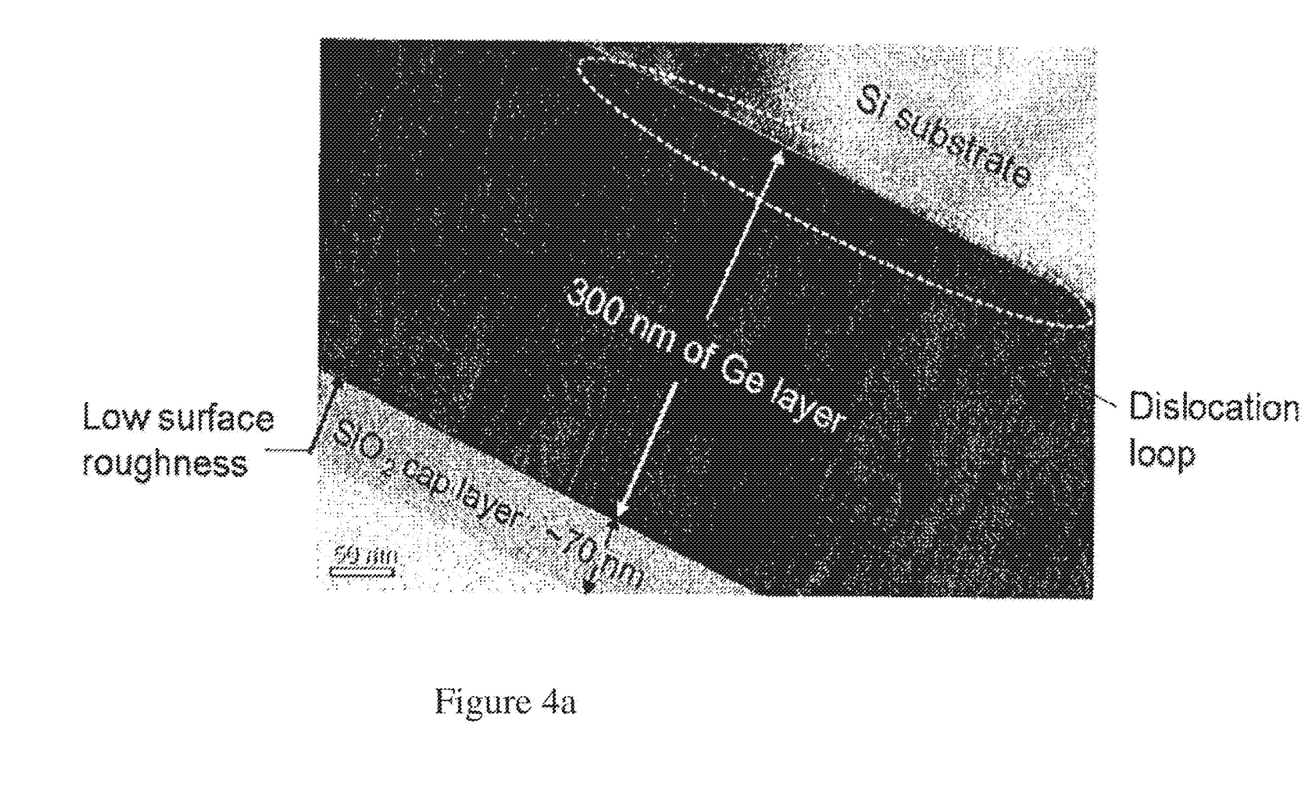
FIG. 4a shows a cross-sectional high resolution transmission electronic microscope (TEM) micrograph of a surface of the Ge layer of FIG. 2b.
Figure 4B:
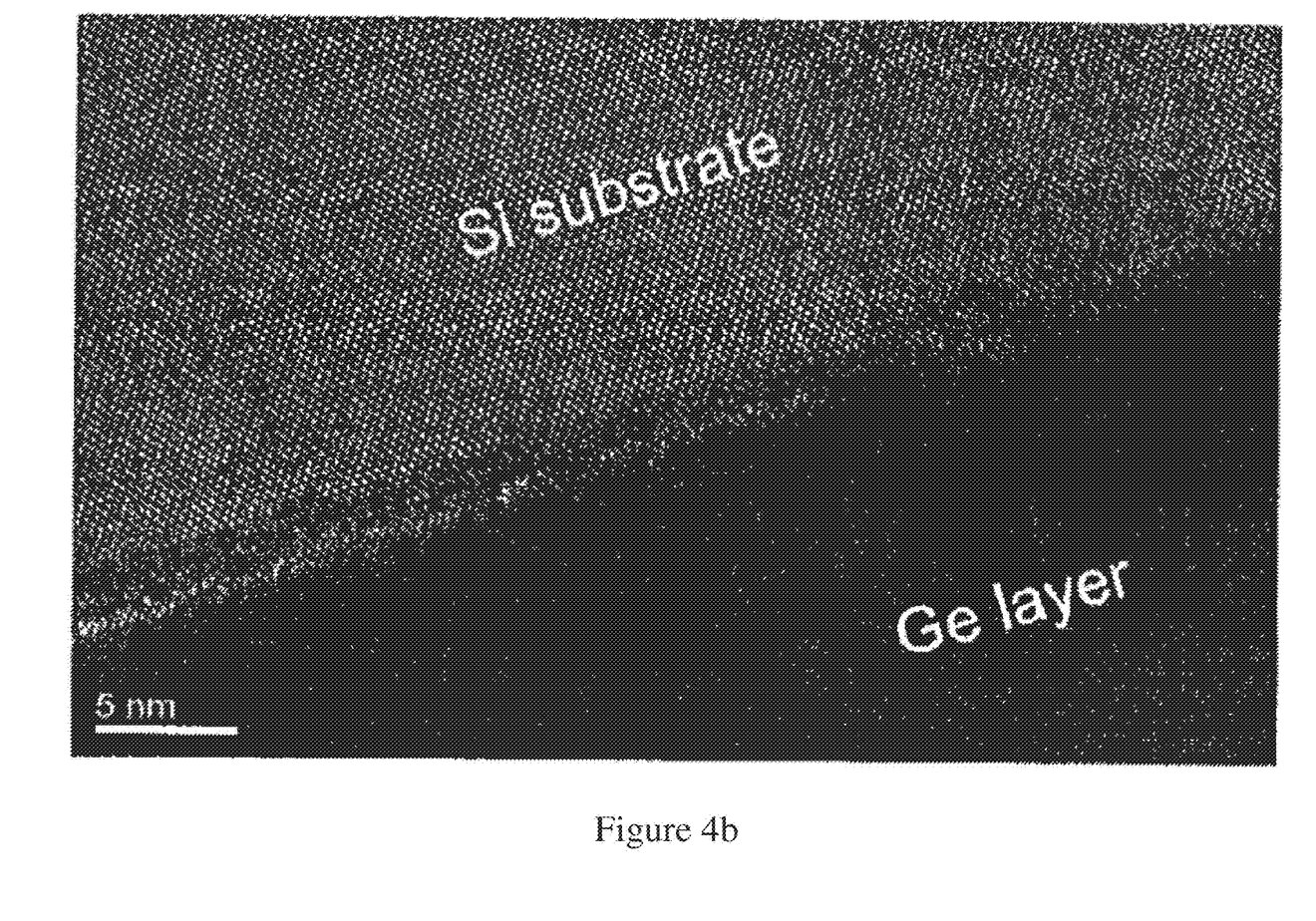
FIG. 4b shows a TEM micrograph of a surface of the Ge layer of FIG. 2b.

FIGS. 4a and 4b show micrographs of cross-sectional transmission electron microscopy (TEM) micrographs taken of the structure of the Ge layer 24 formed in accordance with the method 10. In this example, the Ge layer 24 is approximately 300 nm thick, capped in situ with a Si dioxide layer approximately 70 nm thick.

The surface roughness of the Ge surface 26 shown in FIG. 4a is quite low and is in agreement with the AFM image shown in FIGS. 3a and 3b. This is evidence that the Ge surface 26 is flatter than those obtained by prior art methods.

Figure 5:
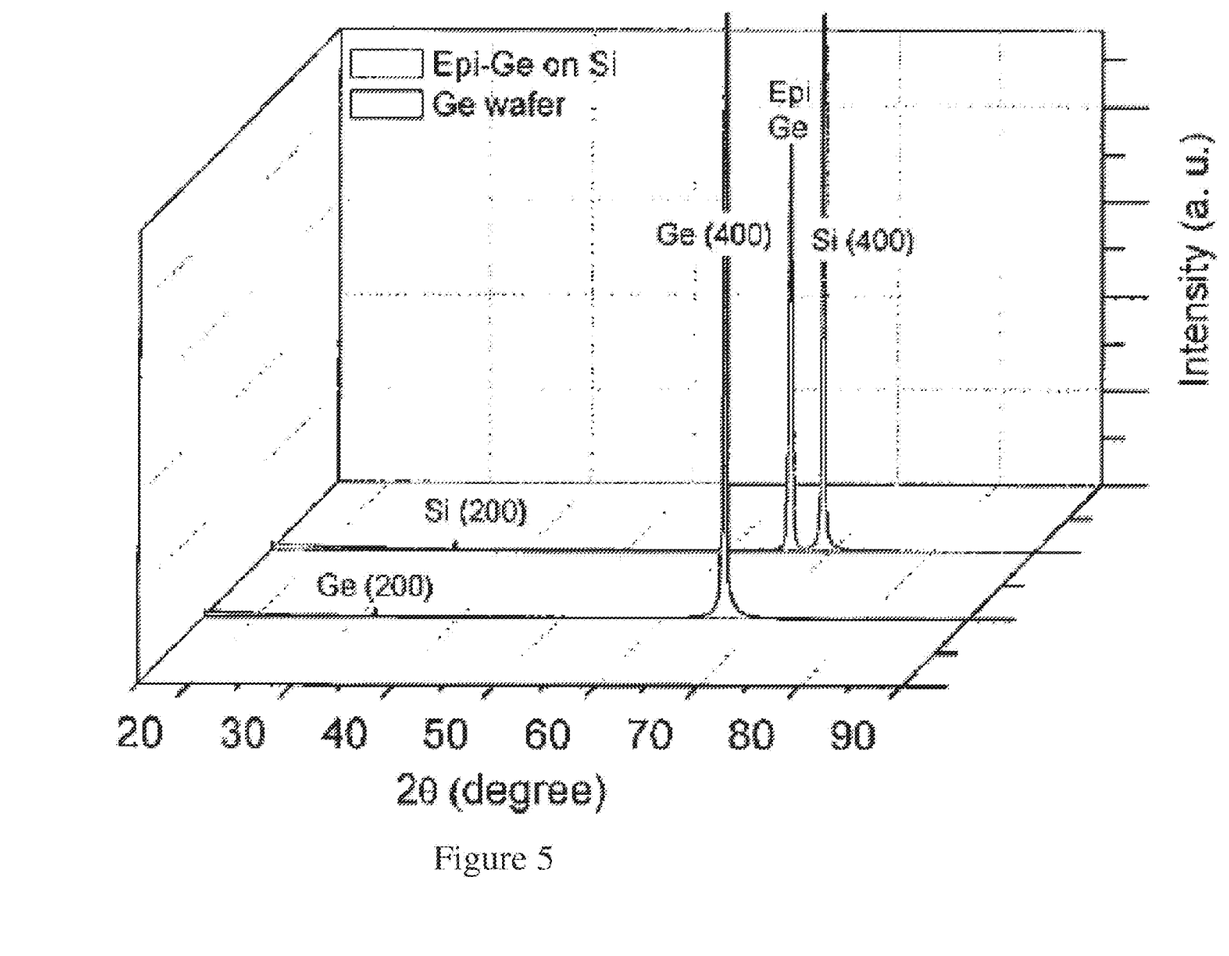
FIG. 5 shows an X-ray diffraction (XRD) pattern of the Ge layer shown in FIG. 2b.

FIG. 5 shows an X-ray diffraction (XRD) pattern of the Ge layer 24 and a reference Ge (100) substrate measured by XRD in the range between 15° and 90° of 2θ degree. The absence of (111), (220), (311), (331) and (422) diffraction peaks at approximately 27°, 45°, 53°, 72° and 83° respectively and the presence of the (400) diffraction peak at around 66° indicate that the Ge layer 24 is likely to be a single crystal. It is worth noting the Ge layer 24 relaxation at the position of the (400) diffraction peak at approximately 66° is the same as that of the reference Ge substrate but is apart from that of the underlying Si substrate 22.

Figure 6:
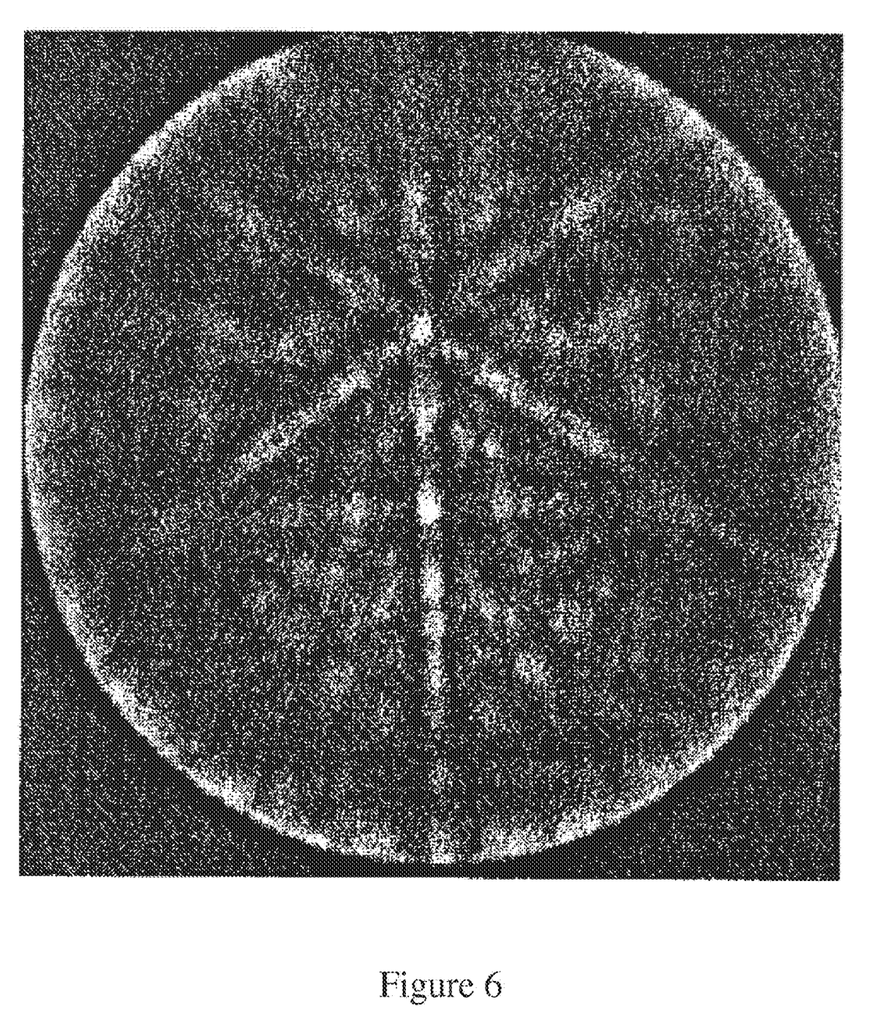
FIG. 6 shows a typical electron back-scattered diffraction (EBSD) pattern of the Ge layer of FIG. 2b.

FIG. 6 shows a typical electron backscatter diffraction (EBSD) pattern of EBSD measurements taken of the Ge layer 24. Kikuchi lines are shown clearly in the pattern of FIG. 6, indicating that the Ge layer 24 is single crystalline.

Figure 7:
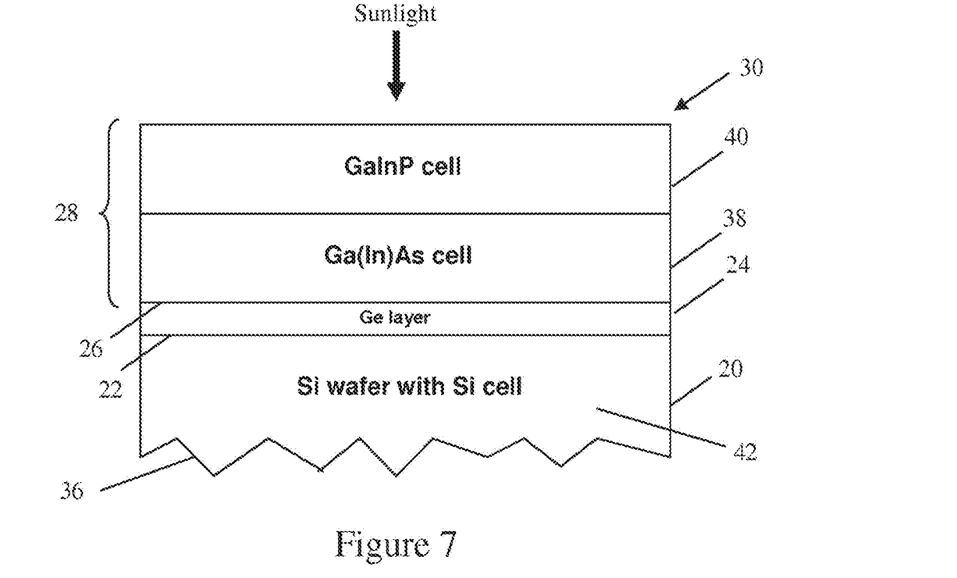
FIGS. 7 to 9 show schematic cross-sectional view of photovoltaic devices in accordance with embodiments of the present invention.
Figure 8:
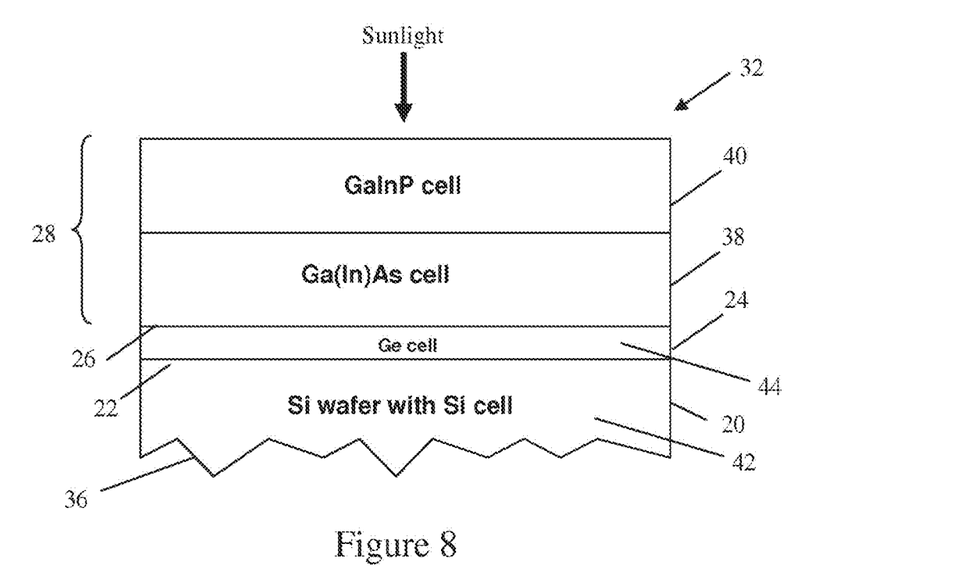
Figure 9:
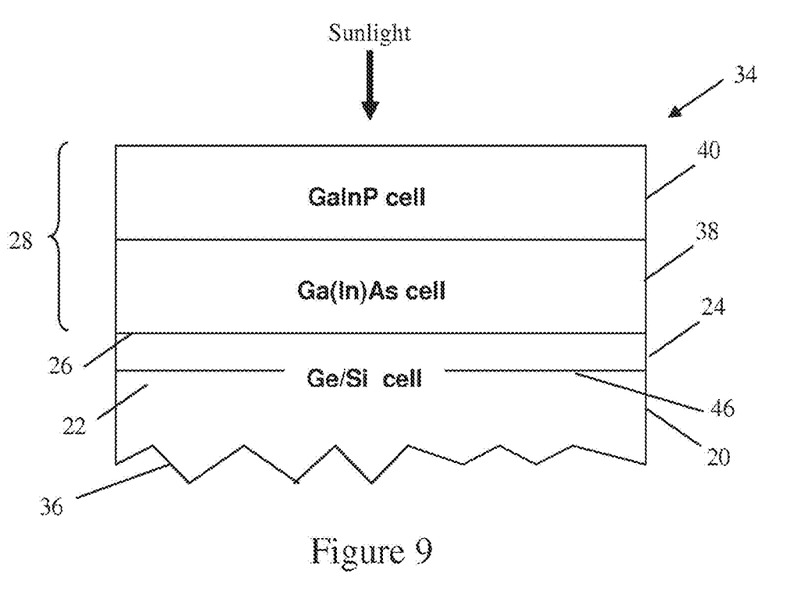

FIGS. 7 to 9 show photovoltaic devices 30, 32 and 34. Each photovoltaic device 30, 32, 34 comprises a Si substrate 20 having front and back surfaces 22, 36 and a Ge containing layer 24 positioned on the front surface 22 of the Si substrate 20. The Ge containing layer 24 may be grown using the above-described method. However, it is to be appreciated that alternatively the Ge containing layer 24 may be grown using different suitable physical or chemical film growth techniques including for example as molecular beam epitaxy (MBE) and chemical vapour deposition (CVD).

Each photovoltaic device 30, 32, 34 comprises a material portion 28 grown on the surface 26 of the Ge containing layer 24. The material portion 28 comprises in this example two photovoltaic cells that are based on III-V group materials. In these examples, the material portion 28 comprises a Ga(In)As cell 38 and a GaInP cell 40 stacked on top of one another. These cells comprise contact layers and are fabricated using known procedures. It is to be appreciated that alternatively the material portion 28 may comprise any suitable other number and type of photovoltaic cells.

Each photovoltaic devices 30, 32, 34 comprise a scattering surface that is textured and that is positioned at the back surface 36 of the Si substrate 20. The photovoltaic devices 30, 32, 34 are therefore arranged such that light that penetrates through the photovoltaic cells of the photovoltaic devices 30, 32, 34 towards the scattering surface is largely reflected back into the Si substrate 20 and at least partially also into the Ge containing layer 24. The refractive index of the Ge containing layer 24 typically is higher than that of the material portion 28 including the III-V material and consequently, dependent on the angle of incidence, total internal refection may further increase the path length of the light in the Si substrate 20 and the Ge containing layer 24. Further, light that is in use reflected at an interface between an exposed top surface of the material portion (including the III-V material) and a gaseous environment (usually air) by total internal reflection is also directed back to Ge containing layer and the Si substrate. Consequently, even if the Ge containing layer is relatively thin, resultant multiple direction of reflected light though the Ge containing layer will increase absorption of the Ge containing layer significantly.

In a first embodiment of the photovoltaic device 30 shown in FIG. 7, the Ge containing layer 24 is a relatively thin layer and interconnects the material portion 28 with the Si substrate 20 that comprises a photovoltaic cell. In this embodiment, the Ge containing layer 24 typically is thinner than 100 nm or even thinner than 50 nm. If the Ge containing layer has such a thickness, only a small portion of the photons will be absorbed when penetrating through the Ge containing layer towards the underlying Si cell. The Ge containing layer 24 may also comprise Si, which reduces the average absorption of the Ge containing layer 24. Consequently, if the Ge layer comprises a significant amount of Si, the layer may also be thicker than mentioned above.

The photovoltaic cell 30 is arranged such that photons that penetrate into the photovoltaic device 30 penetrate, if not absorbed, in sequence through the GaInP cell 40, the Ga(In)As cell 38, the Ge containing layer 24 and the Si cell 42 of the Si substrate 20. In this example the Si substrate 20 typically is p-type and has a heavily doped n-type emitter layer at the front surface 22. The Ge layer 24 is in this example doped p-type (heavily p-type), which results in a poor quality junction at the Si/Ge interface resulting is tunnelling or defect type conduction, which provides a low resistance contact to the underlying Si cell 42.

Referring now to the photovoltaic cell 32 of FIG. 8, in a second embodiment the Ge containing layer 24 comprises active regions of a Ge cell 44. In this embodiment the Si substrate 20 also comprises a Si cell 42. The Ge containing layer 24 is sufficiently thin such that a portion of the photons penetrate through the layer for absorption by the underlying Si photovoltaic cell. The Ge containing layer has in this example a thickness of the order of 30 nm and heterojunctions are formed at interfaces between the Ge containing layer and the material portion including the III-V material and between the Ge containing layer and the Si substrate. As discussed above, the light scattering portion 36 effects light trapping in the Si and the Ge layer. The material specific photon absorption of Ge is much stronger than that of Si, but the Si wafer 42 is much thicker than the Ge containing layer 24 such that both the Ge cell 44 and Si cell 42 absorb a reasonable potion of the light.

It is to be appreciated that in a variation of the first and second embodiments of the present invention the material portion may also comprise only one III-V material photovoltaic cell. Were it not for absorption in the Ge containing layer the optimum bandgap for a top cell is of the order of 1.7 eV. The absorption of the Ge containing layer makes higher bandgap values more advantageous and lattice-matches GaAs—AlAs alloys may be used if the layer 24 is largely composed of Ge or GaAs—GaP alloys if the layer 24 is a SiGe layer. Lattice-match GaInP with a bandgap of 1.8-1.9 eV may also be used. If the Ge containing layer comprises active regions of a Ge cell, the III-V material cell (or cells) may have a higher bandgap than in the case of the Ge containing layer being inactive. The thickness of the Ge layer would be determined by the need to share the absorption of photons passed by the GaInP appropriately between it and the underlying Si cell.

With two cells grown on top of the Ge containing layer as illustrated with reference to the above described first and second embodiments of the present invention, the inactive Ge case would allow close to optimum performance for a Ge matched 3-cell GaInP/GaInAs/Si structure, were it not for the parasitic absorption of the Ge layer. Consequently, relatively thin GaInP and GaInAs are advantageous for compensation. Alternatively, the Ge containing layer 24 may comprise a SiGe alloy (which has lower absorption than pure Ge) and higher bandgap GaAs—GaP and GaP—InP alloys may be used. In case of the Ge containing layer comprising active regions of a Ge cell ("out-of-order" arrangement), thin lattice-matched GaInP and GaInAs layers are advantageous.

Especially for the photovoltaic devices in accordance with the second embodiments of the present invention the scattering structure 36 is advantageous. The effective absorption coefficient of the Ge in the Ge cell will be multiplied by the path length enhancement factor due to the light-trapping, a factor of approximately 30 in good Si cells. This results in an effective Ge absorption coefficient of 15-45/micron over the 1.1-1.55 micron wavelength range, indicating that a Ge layer that has a thickness of approximately 100 nm thick will absorb most of these photons. The absorption coefficient of Ge over the 0.8-1.1 µm range, where it will compete with Si, lies in the 1.5-4/micron range, suggesting a thickness of a fraction of a micron would be required so as not to absorb an excessive number of photons destined for the Si cell. SiGe alloy layers allow better current-matching with higher bandgap III-V cells.

Referring now to FIG. 9, there is shown photovoltaic device 34 in accordance with the third embodiment of the present invention. In this example, the photovoltaic device 34 comprises a rear hetero-junction that is formed at an interface between the Si substrate 20 and the Ge containing layer 24 and forms the p-n junction of a Ge/Si cell 46. The Ge containing layer 24 typically has a thickness of the order of 100 nm. The photovoltaic device 34 typically is arranged such that photons that penetrate into the photovoltaic device 34 penetrate, if not absorbed, in sequence through the GaInP cell 40, the Ga(In)As cell 38 and the Ge/Si cell.

It will be understood to persons skilled in the art of the invention that many modifications may be made without departing from the spirit and scope of the invention.

What is claimed is:

1. A method of forming a single crystalline Ge containing layer on a Si substrate, the method comprising the steps of:
   providing a crystalline Si substrate having a surface that has a crystallographic orientation;
   heating the Si substrate in a vacuum environment;
   exposing the Si substrate to a surfactant, the surfactant being $H_2$ or atomic H; and thereafter
   growing the single crystalline Ge containing layer on the surface of the heated Si substrate using surfactant mediation and a suitable sputtering technique,
   whereby the sputtering technique with the surfactant mediation forms a heteroepitaxial single crystalline Ge layer on the crystalline Si substrate.

2. The method of claim 1, wherein the Ge containing layer has a surface that is composed of Ge.

3. The method of claim 1, wherein the Ge containing layer has a graded concentration profile of material composition and a decreasing concentration of Si in a direction away from the surface of the Si substrate.

4. The method of claim 1, wherein the Ge containing layer has a thickness of less than 400 nm.

5. The method of claim 1, wherein the Ge containing layer has a thickness of less than 300 nm.

6. The method of claim 1, wherein the Ge containing layer has a thickness of less than 200 nm.

7. The method of claim 1, wherein growth conditions are chosen such that no further annealing and/or polishing is required to achieve crystallographic properties suitable for epitaxial growth of the further material.

8. The method of claim 1, wherein the suitable sputtering technique is radio-frequency (RF) sputtering.

9. The method of claim 1, wherein achieving appropriate layer growth conditions comprises setting the temperature of the Si substrate in the range between approximately 350-450° C.

10. The method of claim 7, wherein appropriate sputter wherein achieving appropriate layer growth conditions comprises setting the temperature of the Si substrate at approximately 400° C.

11. The method of claim 1, wherein Ge containing layer is suitable for growth of a single crystalline III-V class semiconductor material.

* * * * *